United States Patent [19]

McMillan

[11] Patent Number: 4,746,799

[45] Date of Patent: May 24, 1988

[54] ATOMIC JET RADIATION SOURCE

[76] Inventor: Michael R. McMillan, 19151 Stedwick Dr., Gaithersburg, Md. 20879

[21] Appl. No.: 890,556

[22] Filed: Jul. 30, 1986

[51] Int. Cl.⁴ .............................................. H01J 27/02
[52] U.S. Cl. .............................. 250/423 R; 250/423 P; 315/111.81; 313/359.1
[58] Field of Search ............... 250/423 R, 423 P, 288, 250/493.1; 315/111.81; 313/359.1, 362.1

[56] References Cited

U.S. PATENT DOCUMENTS

| | | | |
|---|---|---|---|
| 3,541,372 | 11/1970 | Omura et al. | 250/423 R |
| 4,045,677 | 8/1977 | Humphries et al. | 250/423 R |
| 4,199,685 | 4/1980 | Hora et al. | 250/423 P |
| 4,318,028 | 3/1982 | Perel et al. | 250/423 R |
| 4,491,735 | 1/1985 | Smith | 250/423 R |
| 4,521,719 | 6/1985 | Liebel | 250/423 R |
| 4,549,082 | 10/1985 | McMillan | 250/423 R |
| 4,598,231 | 7/1986 | Matsuda et al. | 250/423 R |
| 4,654,183 | 3/1987 | Hersheovitch | 250/423 P |

Primary Examiner—Bruce C. Anderson
Attorney, Agent, or Firm—James J. Brown

[57] ABSTRACT

A compact radiation source is obtainable by cascade ionization of a high pressure gas jet as it emerges into a vacuum. The high frequency electric field causing the ionization can be supplied by either microwave or infrared means. The radiation produced includes ions, atoms, plasma or light, in particular, vacuum ultraviolet radiation.

15 Claims, 4 Drawing Sheets

ATOMIC JET RADIATION SOURCE

BACKGROUND OF THE INVENTION

This invention relates to "point" (very small) sources of radiation used for imaging applications, particularly to those point sources of ions and vacuum ultraviolet (VUV) light used for transfer of patterns during the fabrication of very small structures such as integrated circuits.

Point sources can be used for forming images of patterns by either of two processes. If the radiation can be focused by lenses, as can electrons, ions, or visible light, the radiation emitted by the source can be focused down into a small spot, which can be moved laterally across the surface of a target to write a pattern sequentially. If the radiation cannot be focused, as is the case with x-rays or VUV light, proximity printing, in which a mask is placed very close to the surface of a target, can be used to form an image of the mask pattern on the target. For proximity printing, it is necessary for the source to be as small as possible to prevent blurring of the image.

Because of the high energy densities that are usually present in point sources, the conditions are often not completely controllable, and more than one type of radiation is emitted from the source. This is the case, for example, with liquid metal ion sources, wherein visible light as well as ions are emitted from the tip of a cone formed by the liquid metal. It is conceivable that each type of radiation produced by a point source could be put to a practical use, although this is rarely done.

Point sources of ions are presently being used in machines being sold commercially for x-ray mask repair. In these machines, finely focused ion beams of ions formed from liquid metals such as gallium are used to observe and sputter etch the masks. The potential exists also to do lithography or implantation with these machines, if suitable ion sources can be developed. Lithography can be done with light ions such as $H^+$, $H_2^+$, or $He^+$, and implantation into gallium arsenide can be done with ions from the group $H^+$, $Zn^+$, $Cd^+$, $Si^+$, $Sn^+$, and $Be^+$, while implantation into silicon can be done with ions from the group $B^+$, $N^+$, $Al^+$, $Ga^+$, $As^+$, $In^+$, and $Sb^+$.

Similarly, various point sources of x-rays have been under development for proximity printing, but success has not been immediate. The potential exists to use VUV radiation for proximity printing, since less flux is needed for exposure of lithographic resists. A discussion of VUV lithography is given by G. Coleman and R. A. McCorkle in their article "Ultra-soft x-ray lithography" in the IBM Technical Disclosure Bulletin, Vol. 24, No. 11B, P. 5804, April 1982. As with ion sources, however, common VUV sources lack sufficient brightness. A discharge constructed according to the present invention and utilizing either hydrogen or one of the noble gases provides the required brightness.

A general discussion of ion and light sources used in the microelectronics industry is given in *The Physics of Microfabrication*, by I. Brodie and J. Muray, Plenum, New York (1982).

The U.S. Pat. No. 4,549,082 describing how to make an ion source by charge exchange of an ion beam with a molecular beam has been issued to the present inventor.

The mechanism of microwave breakdown in gases has been discussed by S. Brown in *The Encyclopedia of Physics*, Vol. 22, p. 531 (1956).

A description of a microwave plasma disk ion source has been published by J. Asmussen and J. Root in Applied Physics Letters, Vol. 44, p. 396 (1984).

A description of a microwave discharge atomic hydrogen source has been published by E. Murphy and J. Brophy in The Review of Scientific Instruments, Vol. 50, p. 635 (1979).

A description of a microwave discharge VUV radiation source is given by E. Pellach and H. Sar-el in The Journal of Electron Spectroscopy and Related Phenomena, Vol. 14, p. 259 (1978).

Plasma jets formed from gases at atmospheric pressures using radiofrequency plasma generation, and used for welding torches, are discussed in *Physics and Technology of Low Temperature Plasmas*, ed. by S. Dresvin, Iowa (1977).

A discussion of sources used for x-ray lithography is given by A. Heuberger in Solid State Technology, February 1986, p. 93.

The background for laser radiation induced gas breakdown, including a discussion of cascade ionization, has been presented by D. Smith and R. Meyerrand, Jr. in *Principles of Laser Plasmas*, G. Bekefi, ed., Wiley, New York (1976), p. 457.

An ion source in which a molecular beam is transformed into an ion beam by stepwise excitation of states of the atoms in the beam using tuned lasers is described by R. Dreyfus and R. Hodgson in U.S Pat. No. 3,914,655.

An ion source wherein individual atoms in a rarefied gas are ionized by multiphoton ionization using a powerful pulsed laser, and where the gas density is not sufficiently high for cascade ionization, is described by W. Brubaker et al. in U.S. Pat. No. 3,478,204.

OBJECTS OF THE INVENTION

An object of the invention is to provide a point source of either ions or VUV light as desired, using an atomic jet radiation source.

Another object is to provide a greater selection and intensity of ions than is otherwise available.

A further object is to make it feasible to do VUV lithography by providing a sufficiently intense, yet inexpensive source of radiation. To date, the only alternative source has been a synchrotron, which is relatively expensive, even for compact models presently being developed.

SUMMARY OF THE INVENTION

The objects and advantages of the present invention are achieved with a discharge created by a high frequency electric field in a jet of atoms or molecules as the jet emerges from a pinhole in a gas reservoir. (The atoms or molecules in the jet will be referred to generically as atoms herein.) A small zone in the discharge downstream from the pinhole serves as a point source of radiation emanating from the discharge.

With respect to radiation sources consisting of ionized gases making contact with the walls of a container, wherein the radiation exits through an aperture in the container, the present invention utilizing an atomic jet offers the following advantages:

1. Superior efficiency and brightness.
2. The possibility of using a superior immersion lens to extract ions, because the plasma containing the ions can be kept from contacting the anode aperture of the immersion lens.

These advantages have been discussed in my earlier U.S. Pat. No. 4,549,082. The present invention is an improvement over the earlier one in that:
1. Ionization by electric fields of sufficiently high frequency (microwave frequencies and higher) results in less heating of the ions produced than does charge exchange by an external ion beam.
2. Electrons are not required to be added to the gas being ionized.
3. Collimation of the jet to form a molecular beam is not required.
4. Differential pumping is not necessarily required.

These improvements lead to a simpler, less expensive device with better performance.

DETAILED DESCRIPTION OF THE INVENTION

Figure 1:
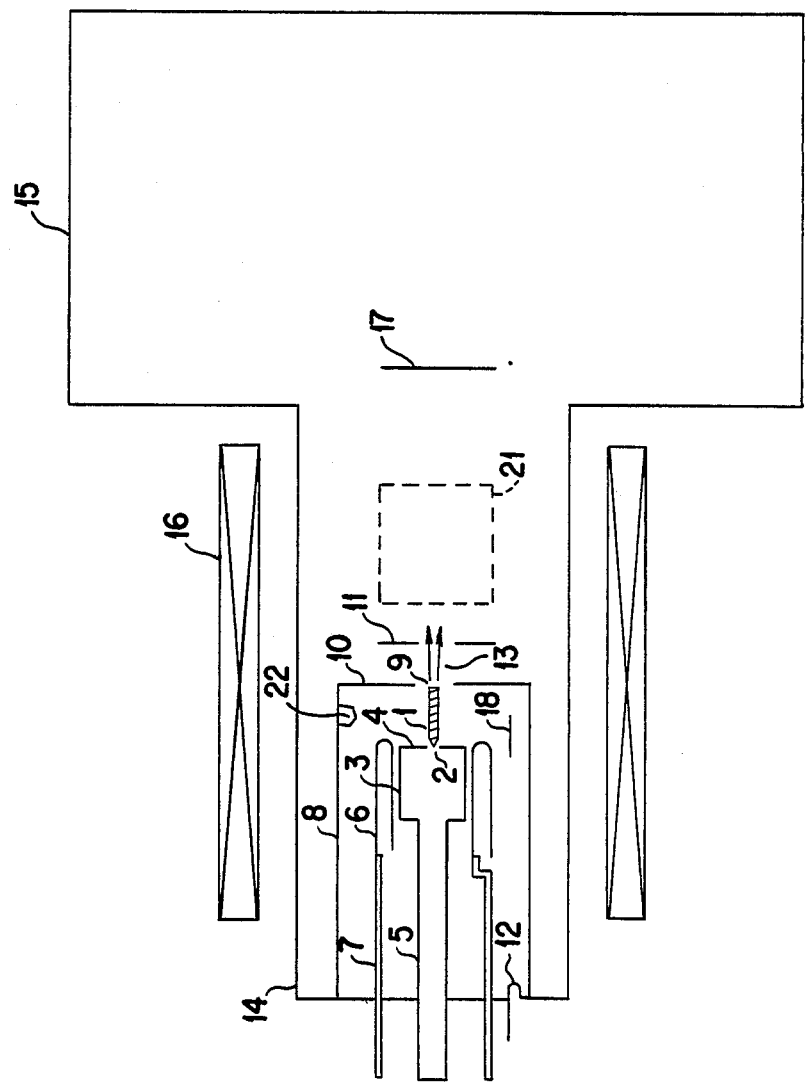
FIG. 1 is a schematic diagram showing a radiation source in accordance with the invention, with an enclosing vacuum chamber and a surrounding solenoid, the discharge being initiated and maintained by a microwave electric field.

FIG. 1 shows in schematic form the essential features of an atomic jet radiation source in accordance with the present invention. The discharge 1 is caused by microwave power applied to gas emanating from a pinhole 2 in gas cell 3. The cylindrically symmetric discharge apparatus 2-12 is enclosed in an extension 14 from a vacuum chamber 15. A solenoid 16 produces an axial magnetic field which confines the discharge radially. A target 17 for the radiation to strike is located along the axis of the source inside the vacuum chamber. Other targets 18 can be located to the side of the source. The discharge can be established in any substance or mixture of substances which can be vaporized. If a substance such as helium or argon is a gas at room temperature, it can be easily supplied to the gas cell via a tube 5. If a substance such as zinc or arsenic is not a gas at room temperature, it is necessary to replace the gas tube by a thin, solid rod, place a small amount of the substance in the gas cell, and vaporize it slowly with the oven 6. The oven can consist of two concentric cylinders of tantalum or molybdendenum joined at one end and heated by electric current, the current entering by one cylinder and leaving by the other. The current can be supplied via current leads 7 from a stepdown transformer using 120 VAC. A similar oven has been described by B. Brutschy and H. Haberland in the Journal of Physics E: Scientific Instruments, Vol. 13, p. 150 (1980). If the oven is used, it is necessary to water-cool cylinder 8 and place heat shields between the oven and the cylinder. (Heat shields and cooling jacket are not shown). It is also necessary to make sure the gas cell is heated near the pinhole to keep the pinhole from clogging. The heat can be supplied by electrons from the discharge, as will be shown.

The microwave discharge occurs in a resonant cavity formed by two coaxial cylinders and excited by a loop antenna 12. The two cylinders consist of the tube 8 closed at both ends, and the oven and its leads, closed at one end by the face 4 of the gas cell. (If the oven is not present, the center cylinder can be the gas tube 5.) This arrangement forms a "short gap" or "re-entrant" cavity, wherein an oscillating electric field is set up in the capacitor formed by plates 4 and 10. Such a cavity and its dimensions are described by O. P. Gandhi in *Microwave Engineering and Applications*, Pergamon, New York (1985), pp. 262–265. The electric field causes the discharge by accelerating free electrons which collide with gas atoms, the electrons reversing their directions after the collisions and keeping their velocities in phase with the electric field, thereby gaining energy and eventually ionizing some of the gas atoms. This process is called cascade ionization. It requires a high gas density to give a high electron collision frequency approximately equal to the microwave frequency. (This happens for a density $n=3.3\times10^{16}$ cm$^{-3}$ for helium when the microwave frequency is 245 GHz.) Initial free electrons can be provided by preionization of the jet with a radioactive source. If more intense pre-ionization is required, the free electrons produced by a radioactive source or by cosmic rays can be accelerated to produce secondary electrons by using a light pulse from a powerful laser, or a spark from a Tesla coil conducted along a wire to the vicinity of the jet. The mixture of ions and electrons is called a plasma, and the mixture of gas and plasma is called a discharge. After the discharge occurs, it is resonantly maintained by the electrons oscillating as a body at the microwave frequency in a potential well formed by their attraction for the ions. Only a few watts of microwave power are required to maintain the discharge.

Figure 2:
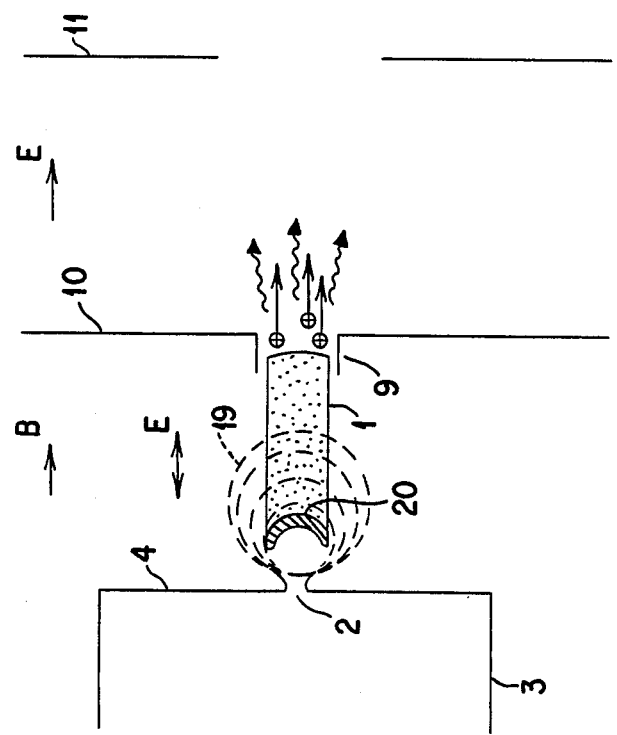
FIG. 2 is a schematic diagram showing a blow-up of the microwave discharge and neighboring electrodes.

Details of the discharge are shown schematically in FIG. 2. The gas emerges as a hydrodynamic jet from the pinhole 2, and makes a gradual transition to molecular flow a few pinhole diameters downstream. The isodensity contours of the jet under conditions of molecular flow are spheres 19 resting on the hydrodynamic portion of the jet, the gas density being lower the larger the sphere. The discharge and the magnetic field act to form a second jet, this jet being composed of plasma, as follows:

The gas density in the jet decreases steadily with distance away from the pinhole, the decrease depending on the angle away from the axis. Along the axis of the jet, free electrons moving toward the pinhole can penetrate the jet only up to a certain distance away from the pinhole, where the gas density is equal to about $10^{18}$ cm$^{-3}$. In the region of the jet bounded by gas of this density and about one tenth of this density, most of the electron-atom collisions occur. This collision zone 20 is where most of the excitation and ionization of the atoms occurs, and thus it acts as a radiation source. Depending on the pressure in the gas cell, which can range up to about 100 atmospheres, the collision zone can be located anywhere from the pinhole itself up to about 200 pinhole diameters downstream from the pinhole along the axis of the jet. Correspondingly, it can vary in diameter with gas cell pressure. To make a small source, it is necessary to keep the gas cell pressure relatively low, at about 1 atmosphere, where the collision zone is a cylinder about 200 microns long and about 100 microns in diameter.

Plasma created in the collision zone generates pressure, which drives plasma out of the collision zone. The electrons in the plasma are confined radially to a cylinder by the magnetic field, and the ions are confined electrostatically by the electrons. The combined effect of the pressure and the confinement is to produce a cylindrical plasma jet in the discharge. The electrons can move freely back and forth along the jet; in particular, electrons move toward the gas cell. They can cause more ionization in the collision zone, or if they are too far from the axis, they can pass through the edge of the jet and hit the gas cell, thus heating the gas cell near the pinhole and being removed from the discharge. The radius beyond which electrons stop being confined by collisions with the atoms of the jet defines the boundary for the jet. If the discharge is terminated at the downstream end by an arrangement which reflects electrons and removes ions, electrons will be contained by the magnetic field and reflections at either end of the discharge. The more effectively electrons are contained in the discharge, the more efficiently electrical energy is converted to radiated energy. Equivalently, for a given input power, an efficient source is brighter.

Other significant radiation from the collision zone consists of metastable or ground state atoms, free radicals, and electromagnetic radiation (light). In general, this radiation emanates in all directions from the collision zone, which appears at a great distance as a point source. Some of the radiation can be reflected from the dense gas upstream from the collision zone. This gas acts as a mirror for resonance radiation, VUV and otherwise, directing the light into a beam. Other wavelengths of light are amplified by stimulated emission to form laser beams. This happens for gas mixtures used in the common gas discharge CW lasers, such as He-Ne, $CO_2$-$N_2$-He, Ar, etc. Excimer laser action also occurs. Mirrors to assist the amplification can be placed on the face of the gas cell and behind the cathode.

At the other end of the discharge from the collision zone, it is necessary that the aperture there be sufficiently large to keep the discharge from contacting it significantly. If this were to happen, power loss would occur, and disruptive electric fields would be created. The shape of the aperture is not critical for use of the invention as a VUV source. For use as an ion source, it is necessary to shape the aperture and apply the correct electric field between the anode and the cathode in order to endow the electrostatic immersion lens so formed with superior optical properties. This procedure has been described in U.S. Pat. No. 4,549,082 by the present inventor. It is also necessary to have the gas density sufficiently low downstream from the anode, so that charge exchange does not occur between extracted ions and ambient atoms.

Downstream from the cathode 11 it is necessary to have apparatus 21 to deflect the ions into a catcher if only the VUV light is of interest. Alternately, if the ions are of interest, and the VUV provides interference, apparatus 21 will consist of ion optics, with most of the VUV eliminated by focusing the ions through a pinhole.

A selection of parameters for the operation and performance of the source with helium are as follows:
1. Gas cell pressure: 1 atmosphere.
2. Pinhole diameter: 20 microns.
3. Separation between pinhole and anode aperture: 5 millimeters.
4. Anode aperture diameter: approximately 200 microns.
5. Magnetic field strength: approximately 2 kilogauss.
6. Dominant VUV radiation: 584 A (21.2 eV) and 304 A (40.8 eV).

Additional embodiments of the invention exist and are considered to fall within the scope of the invention described here. One such variation is to use a different microwave cavity than that shown in FIG. 1. Alternate re-entrant cavity designs exist, as discussed by K. Spangenberg in *Vacuum Tubes*, McGraw-Hill, New York (1948), pp. 529–537. Also, the cavity can be excited by a stub dipole antenna instead of a loop antennna.

Figure 3:
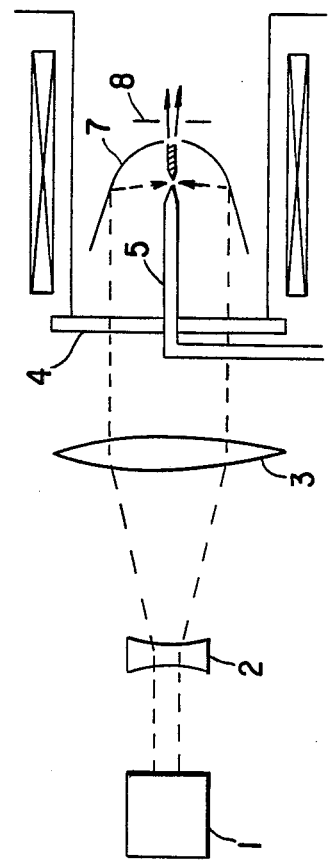
FIG. 3 is a schematic diagram showing a variation of the invention, wherein the discharge is caused by radiation from a laser.

Another such variation is the use of a higher frequency of the electric field driving the discharge to obtain a higher plasma density than can be achieved with microwaves. Higher frequency regimes for which technology is available are the ultraviolet, visible, and infra-red regions of the spectrum. Light in these regions can be used to ionize the jet as shown schematically in FIG. 3. In this figure, which is similar in many respects to FIG. 1, light from a laser 1 is expanded and collimated by lenses 2 and 3, passed into a vacuum chamber through transparent plate 4, and focused by parabolic mirror 7 onto the gas jet emerging from the end of tube 5. Ions are extracted by cathode 8 through an aperture in mirror 7, which also functions as an anode. Initiation of the discharge proceeds by acceleration of free electrons in high pressure gas by the electric field of the light using cascade ionization in a manner identical to that occurring with microwave excitation, with the additional benefit that some free electrons are created by multiphoton absorption. With this mechanism, it is not necessary that the laser light be tuned to an absorption line of the atoms in the jet. Best mode operation is with infra-red light at 10.6 microns from a $CO_2$ laser. For operation with helium, the pressure in the gas tube should be about 10–100 atmospheres. About 100 watts of power at 10.6 microns are required to maintain the discharge, making this method somewhat more expensive than the method using microwaves.

Other variations of the invention are possible in which little or no effort is made to confine the discharge produced in the jet. Such variations are shown schematically in FIGS. 4a–4c and are described as follows.

Figure 4A:
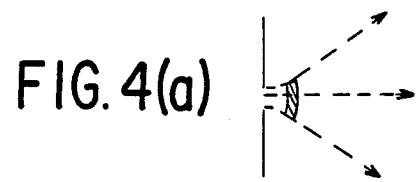
FIGS. 4a–4c are further variations of the invention, wherein the degree of confinement of the discharge has greater utility for some applications.

In FIG. 4a there are no confining electric or magnetic fields. An appropriate method of maintaining the discharge is to apply a microwave electric field between the gas cell and a screen a short distance away. The radiation produced includes light and a diffuse plasma.

Figure 4B:
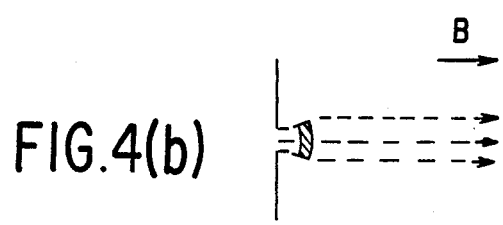

In FIG. 4b, a magnetic field is applied to the discharge. Either microwave or infra-red electric field excitation is appropriate. Light and a plasma jet are produced.

Figure 4C:
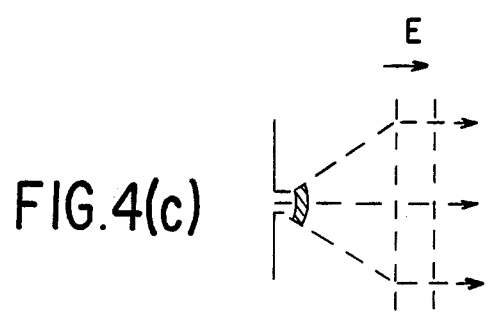

In FIG. 4c, an electric field is applied to the discharge downstream from the pinhole. Microwave excitation with screen anode and cathode electrodes are appropriate. Light and a broad ion beam are produced.

In embodiments where a magnetic field is used to confine the discharge, a variation is to shape the magnetic field to produce desirable effects in the discharge. One such shape is a constriction or intensification of the magnetic field in the vicinity of the pinhole, to form a magnetic mirror and reduce electron loss to the gas cell. A corresponding reduction of the magnetic field at the anode reduces space charge upon ion extraction.

In cases where both electric and magnetic fields confine the discharge, a variation is to increase the radiation output by making an array of sources, using many pinholes in the gas cell matched with corresponding apertures in the anode and cathode.

I claim:

1. An atomic jet plasma and light source comprising:

a jet of atoms or molecules issuing into a vacuum region containing free electrons from a pinhole in a gas cell containing said atoms or molecules in a gas state at about 1–100 atmospheres;

high frequency electric field means for accelerating said electrons and establishing and maintaining a discharge in an electron-atom collision zone located between the pinhole and a point up to 200 pinhole diameters downstream in the jet from the pinhole, thereby producing plasma and light which radiate outward from the collision zone.

2. The atomic jet plasma and light defined in claim 1, further including a magnetic field parallel to the axis of the jet to confine the plasma to a cylinder around the axis, thereby forming a plasma jet.

3. An atomic jet ion and light source comprising:

a jet of atoms or molecules issuing into a vacuum region containing free electrons from a pinhole in a gas cell containing said atoms or molecules in a gas state at about 1–100 atmospheres;

high-frequency electric field means for accelerating said electrons and establishing and maintaining a discharge in an electron-atom collision zone located between the pinhole and a point up to 200 pinhole diameters downstream in the jet from the pinhole, producing plasma and light which radiate outward from the collision zone;

anode and cathode screen electrodes, perpendicular to the axis of the jet, downstream from the jet, and separated from each other by a small distance, said anode held at gas cell potential and said cathode held at a negative potential to extract ions from the plasma and repel electrons back into the plasma, said light passing out through the apertures in said screen electrodes.

4. An atomic jet ion and light source comprising:

a jet of atoms or molecules issuing into a vacuum from a pinhole in a gas cell containing said atoms or molecules in a gas state at about 1–100 atmospheres;

pre-ionization means disposed downstream of said pinhole for increasing the number of free electrons in the jet;

high-frequency electric field means for accelerating said electrons and establishing and maintaining a discharge in an electron-atom collision zone located between the pinhole and a point up to 200 pinhole diameters downstream in the jet from the pinhole, producing plasma and light which radiate outward from the collision zone;

a magnetic field parallel to the axis of the gas jet to form a plasma jet;

anode and cathode electrodes, each electrode consisting of a metal plate or screen containing a circular aperture, said electrodes situated perpendicular to the axis of the gas jet, downstream from the pinhole and separated from each other by a smally distance, said apertures being coaxial with said plasma jet and larger in diameter than this jet, ions being extracted from the plasma jet by said cathode, and light passing through said apertures or said apertures and screens.

5. The radiation source defined in claim 1, wherein:

a re-entrant microwave cavity is present, a part of said cavity consisting of two closely-spaced metal electrodes forming a capacitor, said jet emerging from a pinhole in one of the electrodes and striking the other electrode, said cavity and said electrodes providing said electric field means.

6. The high frequency electric field means defined in claim 5, wherein:

said re-entrant microwave cavity further consists of a gas tube with a gas cell at one end, said gas cell being terminated by a flat face perpendicular to the axis of the tube and the cell, the tube and the cell being enclosed by a coaxial tube which is terminated by plates at both ends, the plate nearest the gas cell forming said capacitor with the face of said gas cell.

7. The re-entrant microwave cavity defined in claim 6, wherein said gas cell is enclosed by a tubular oven, said oven being enclosed in turn by said coaxial tube.

8. The high frequency electric field means defined in claim 5, wherein said microwave cavity operates at a frequency of 2.45 GHz.

9. The radiation source defined in claim 1, wherein said high frequency electric field means is a focusing means for light.

10. The high frequency electric field means defined in claim 9, wherein said focusing means is a parabolic mirror with its focus located between the pinhole and a point up to 20 pinhole diameters downstream in said jet from said pinhole.

11. The focusing means defined in claim 10, wherein said parabolic mirror is concave toward the jet, has an aperture on its axis, and serves as an anode for the extraction of ions from the discharge and the electrostatic containment of the discharge.

12. The high frequency electric field means defined in claim 9, wherein said light is obtained from a laser.

13. The laser means defined in claim 12, wherein said laser is a $CO_2$ laser operating at 10.6 microns.

14. The light source defined in claim 1 wherein said jet consists essentially of helium.

15. The plasma and light source of claim 1 wherein pre-ionization means for increasing the number of free electrons in the jet is provided downstream of said pinhole.

* * * * *